(12) United States Patent
Curtis et al.

(10) Patent No.: US 11,930,617 B2
(45) Date of Patent: Mar. 12, 2024

(54) ENHANCED INFORMATION HANDLING SYSTEM COMPONENT IMMERSION COOLING VIA PUMP RETURN CONNECTION

(71) Applicant: Dell Products, L.P., Round Rock, TX (US)

(72) Inventors: Robert Boyd Curtis, Georgetown, TX (US); Shawn Paul Hoss, Georgetown, TX (US)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 17/380,457

(22) Filed: Jul. 20, 2021

(65) Prior Publication Data
US 2023/0025254 A1 Jan. 26, 2023

(51) Int. Cl.
*H05K 7/20* (2006.01)
(52) U.S. Cl.
CPC ..... *H05K 7/20236* (2013.01); *H05K 7/20145* (2013.01); *H05K 7/20163* (2013.01); *H05K 7/20254* (2013.01); *H05K 7/20272* (2013.01)
(58) Field of Classification Search
CPC ........... H05K 7/20236; H05K 7/20145; H05K 7/20163; H05K 7/20254; H05K 7/20272; H05K 7/203; G06F 1/20
See application file for complete search history.

(56) References Cited

U.S. PATENT DOCUMENTS

| | | | | |
|---|---|---|---|---|
| 9,237,675 | B2 * | 1/2016 | Iwata | G06F 1/203 |
| 10,194,559 | B2 * | 1/2019 | Saito | H01L 23/473 |
| 10,750,637 | B1 * | 8/2020 | Alissa | H05K 7/20818 |
| 10,773,192 | B1 * | 9/2020 | Lau | H05K 7/20272 |
| 10,791,647 | B1 * | 9/2020 | Miyamura | H05K 7/20272 |

(Continued)

FOREIGN PATENT DOCUMENTS

CN 110275594 A * 9/2019 ............... G06F 1/20

OTHER PUBLICATIONS

Ma Zhuang, "Double-cold-source heat dissipation system and heat dissipation method for liquid cooling server", Sep. 24, 2019, Suzhou Inspur Intelligent Tech Co. LTD., Entire Document (Translation of CN 110275594) (Year: 2019).*

*Primary Examiner* — Stephen S Sul
(74) *Attorney, Agent, or Firm* — Fogarty LLP

(57) ABSTRACT

Information handling system (IHS) component immersion cooling systems and methods employ an apparatus having an IHS component immersion cooling flow passage housing disposed at (a) IHS component(s) of an IHS disposed in an immersion cooling tank. The IHS component immersion cooling flow passage housing has an immersion fluid inlet open to immersion fluid within tank and an immersion fluid outlet connected to a return line of an immersion fluid pump. The IHS component cooling apparatus flow passage housing may be a cold plate or a ducted heatsink disposed on, or about, the IHS component(s) of the IHS disposed in the immersion cooling tank. The immersion fluid pump may be the pump that also circulates the immersion fluid within the tank. The tank may include a manifold in fluid flow communication with the pump. This manifold may receive a plurality of return lines, each from an IHS component cooling apparatus.

20 Claims, 10 Drawing Sheets

(56) References Cited

U.S. PATENT DOCUMENTS

| | | | |
|---|---|---|---|
| 2008/0068796 A1* | 3/2008 | Pav | G06F 1/20 |
| | | | 361/695 |
| 2009/0205810 A1* | 8/2009 | Wan | G06F 1/20 |
| | | | 165/80.4 |
| 2017/0177041 A1* | 6/2017 | Shelnutt | H05K 7/20809 |
| 2019/0357384 A1* | 11/2019 | Saito | H05K 7/20236 |
| 2020/0015383 A1* | 1/2020 | Gao | H05K 7/20763 |
| 2020/0267872 A1* | 8/2020 | Harada | H05K 7/208 |
| 2020/0315055 A1* | 10/2020 | Tian | H05K 7/20809 |
| 2021/0185850 A1* | 6/2021 | Kulkarni | H05K 7/20381 |
| 2022/0187023 A1* | 6/2022 | Kang | F28D 1/0226 |
| 2022/0201896 A1* | 6/2022 | Edmunds | H05K 7/20781 |
| 2022/0264768 A1* | 8/2022 | Horng | H05K 7/20318 |
| 2022/0408587 A1* | 12/2022 | Kelley | H05K 7/20809 |

* cited by examiner

ENHANCED INFORMATION HANDLING SYSTEM COMPONENT IMMERSION COOLING VIA PUMP RETURN CONNECTION

FIELD

This disclosure relates generally to Information Handling Systems (IHSs), and more specifically, to enhanced IHS component immersion cooling via a pump return connection.

BACKGROUND

As the value and use of information continue to increase, individuals and businesses seek additional ways to process and store information. One option is an Information Handling System (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated.

The variations in IHSs allow for IHSs to be general or configured for a specific user, or for a specific use such as financial transaction processing, airline reservations, enterprise data storage, global communications, etc. In addition, IHSs may include a variety of hardware and software components that may be configured to process, store, and communicate information and may include one or more computer systems, data storage systems, and networking systems.

Typically, IHSs are designed for air cooling. Conventional IHSs (e.g., servers, etc.) usually comprise one or more printed circuit boards having a plurality of electrical components mounted thereon—these printed circuit boards are housed in an enclosure having vents that allow external air to flow into the enclosure, and then out of the enclosure after being routed internally through the enclosure for cooling the IHS. In many instances, a fan is also located within the enclosure to facilitate this airflow.

In general, a lower air temperature allows each IHS component to dissipate more power and therefore operate at a level of hardware performance. Consequently, IHS facilities (e.g., data centers, etc.) have used sophisticated air conditioning systems to cool the air within it for achieving a desired performance level. As energy costs and power dissipation continue to increase, however, the total cost of cooling these facilities has also increased.

As an alternative to air cooling, immersion cooling of IHSs (e.g., in a dielectric liquid coolant, as opposed to air) may be employed. Immersion cooling has the potential of becoming a popular server cooling solution as it enables elimination of air-cooling infrastructure, and the like, including on-board server fans, computer room air conditioning, compressors, air-circulation fans, necessary duct work, air handlers, and other active ancillary systems such as dehumidifiers. These systems are replaced with one or more low speed liquid circulation pumps, a heat exchanger, and/or the like.

SUMMARY

Embodiments of enhanced Information Handling System (IHS) component immersion cooling via (a) pump return connection(s) are described. In illustrative, non-limiting embodiments, IHS component immersion cooling systems and methods employ an apparatus having an IHS component immersion cooling flow passage housing disposed at (a) IHS component(s) of an IHS disposed in an immersion cooling tank. The IHS component immersion cooling flow passage housing has an immersion fluid inlet open to immersion fluid within tank and an immersion fluid outlet connected to a return line of an immersion fluid pump. The IHS component cooling apparatus flow passage housing may be a cold plate or a ducted heatsink disposed on, or about, the IHS component(s) of the IHS to be cooled by the immersion fluid during operation of the IHS. The IHS may be a server. The component(s) to be cooled herewith may be (a) central processing unit(s) (CPU(s)), (a) graphics processing unit(s) (GPU(s)), etc. The immersion fluid may be oil. The immersion fluid pump may be the pump that also circulates the immersion fluid within the tank. The tank may include a manifold in fluid flow communication with the pump. This manifold may receive a plurality of return lines, each from an IHS component cooling apparatus.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity, and have not necessarily been drawn to scale.

DETAILED DESCRIPTION

For purposes of this disclosure, an Information Handling System (IHS) may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., Personal Digital Assistant (PDA) or smart phone), server (e.g., blade server or rack server), a network storage device, or any other suitable device and may vary in size, shape, performance, functionality, and price. An IHS may include Random Access Memory (RAM), one or more processing resources such as a Central Processing Unit (CPU) or hardware or software control logic, Read-Only Memory (ROM), and/or other types of nonvolatile memory. Additional components of an IHS may include one or more disk drives, one or more network ports for communicating with external devices as well as various I/O devices, such as a keyboard, a mouse, touchscreen, and/or a video display. An IHS may also include one or more buses operable to transmit communications between the various hardware components. A more detailed example of an IHS is described with respect to FIG. 11.

Figure 1:
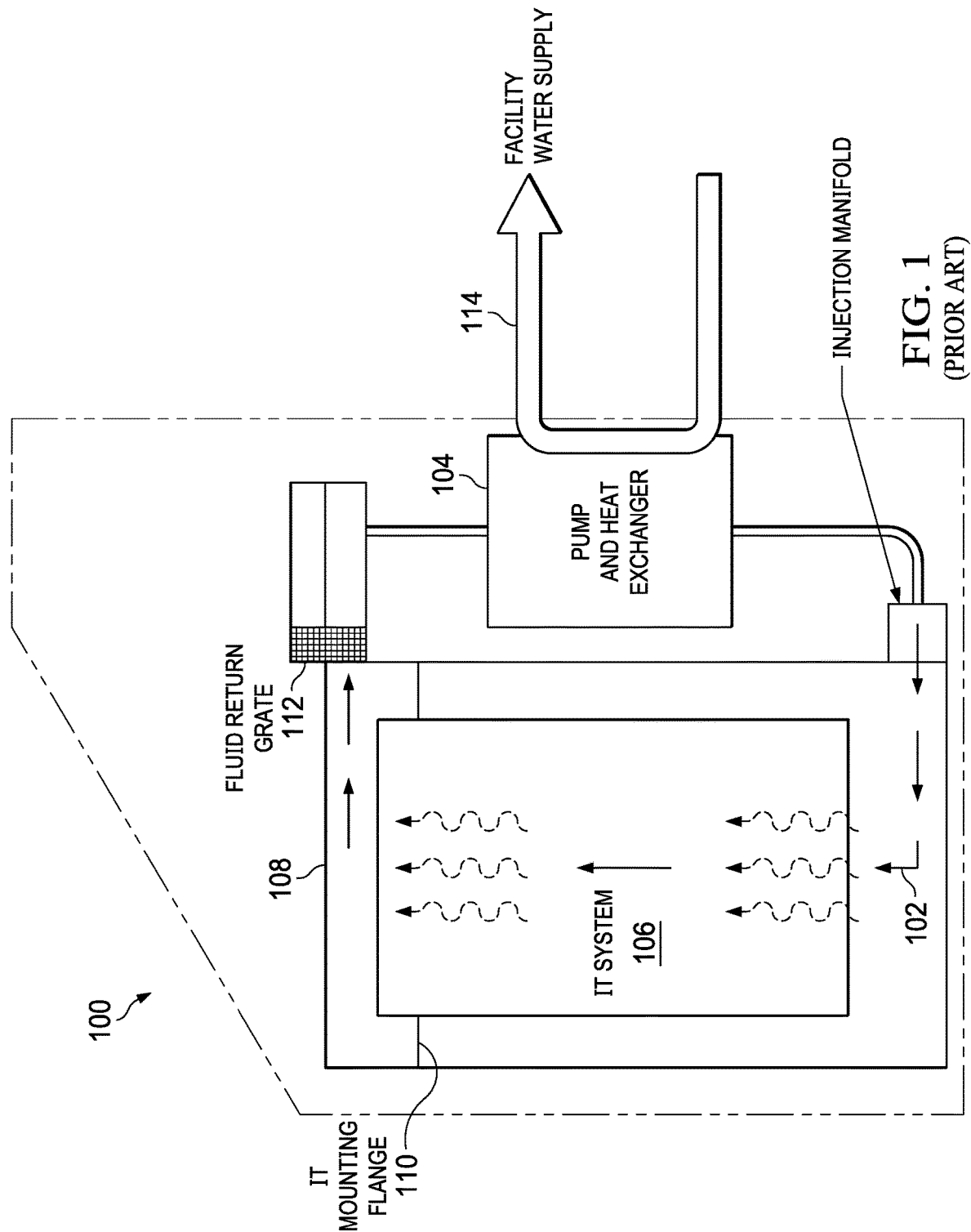
FIG. 1 is a diagrammatic illustration of an example of immersion fluid flow in a prior art immersion Information Handling System (IHS) cooling system.
Figure 2:
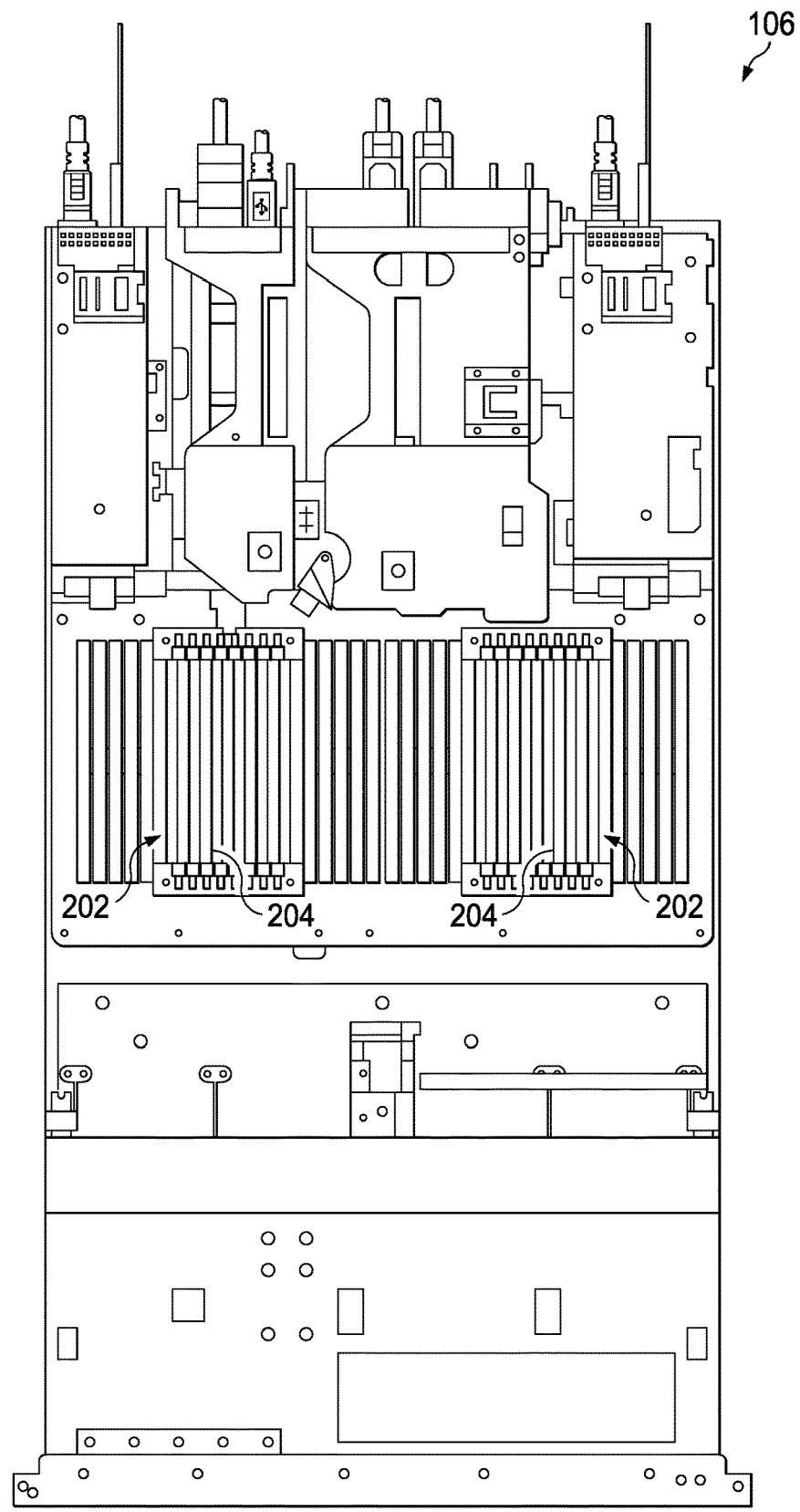
FIG. 2 is a diagrammatic illustration of an example prior art IHS adapted for use in a prior art immersion IHS cooling system.

FIG. 1 is a diagrammatic illustration of example immersion fluid flow in prior art immersion IHS cooling system 100. Therein, bulk flow 102 provided by tank pump or pumping module 104 typically results in no control of flow to each node 106 within the tank and no direction of flow directly to a CPU or other high power component(s) in a node. FIG. 2 is a diagrammatic illustration of example prior art IHS 106 adapted for use in a prior art immersion IHS cooling system, such as system 100 of FIG. 1. IHS 106, which may be referred to as a "node," or the like may employ "oil optimized" heatsink 202, deployed on a CPU, or the like. Such an oil optimized heatsink 202 typically has with fewer fins 204, compared to an air cooled heat sink, for example, to help increase immersion fluid flow through (i.e., across) the heatsink.

In various embodiments, system 100 may be capable of cooling one or more IHSs 106 containing heat-generating components by reducing the temperature difference between heat generating or dissipating components, and an "immersion fluid" used to cool those components. As used herein, the term "immersion fluid" includes a liquid coolant that may be any non-conductive liquid such that electrical components of an IHS (e.g., a motherboard, a memory, CPU, and other electrical and/or electronic components designed for use in air) continue to operate reliably while submerged without significant modification. In some embodiments, a suitable immersion fluid is a "single phase" dielectric liquid coolant, including for example vegetable oil, mineral oil (e.g., transformer oil), etc.

System 100 includes tank 108 containing a dielectric immersion fluid into which a plurality of IHSs may be immersed or submerged. A rack or mounting flange 110 is positioned within tank 108 and is configured to receive and mount the plurality of IHSs 106 into tank 108. Tank 108 may have an opening, such as an open top, for access to each of IHSs 106 mounted in flange 110. At least a portion of each IHS 106 is submerged within the dielectric immersion fluid for cooling each respective IHS when tank 108 is sufficiently full of the immersion fluid. In various embodiments, each of IHSs 106 is completely submerged within the dielectric immersion fluid during their normal operation.

The immersion fluid heated by IHSs 106 in flange 110 is coupled, through grated fluid return 112, or the like to piping or lines to a pump, which may be integrated with a heat exchanger, as illustrated as 104, which pumps heated immersion fluid from tank 108 for heat-rejection or cooling such as through the use of facility water supplied at 114. The cooled immersion fluid through a fluid supply line or piping back into tank 108.

Thus, in existing IHS immersion cooling implementations where the tank pump module pumps bulk flow into the tank, flow through the compute nodes is determined only by the total flow rate and impedance of the individual hardware nodes installed in the tank. Existing IHS immersion cooling tanks have no mechanism for controlling flow through each hardware node Existing tanks have no mechanism for controlling flow through each hardware node or for controlling flow within the immersed hardware. Cooling limitations arise at IHS CPUs (and other areas), particularly in fully populated IHS immersion cooling tanks.

In accordance with embodiments of the present systems and methods, increased flows through each hardware node and/or forced flow at the CPU will increase cooling capabilities at the CPU. Other high-power components, such as a Graphics Processing Unit (GPU), may also benefit from such increased flows through each hardware node and/or forced flow directed directly at the high power component(s), as well. To wit, embodiments of the present systems and methods implement flow enhancement by connecting a component cooling solution to the suction side of the immersion cooling system pump. That is, in accordance with embodiments of the present systems and methods, the inlet or suction side of the immersion cooling system pump is connected, via one or more hoses, to one or more high power use components within the system. In accordance with such embodiments, the immersion cooling system pump pulls flow directly through the high power use component(s) (e.g., CPU, GPU, or the like) that may benefit from cooling provided by such higher flows of immersion cooling fluid. In accordance with some embodiments of the present systems and methods, these suction lines may be mated to a cold plate adapted for use of oil immersion fluids and optimized for component cooling (e.g., CPU cooling). In accordance with other embodiments, the suction line(s) may be connected to a ducted heatsink disposed on, or about, one or more high power use components. Resultingly, this suction-based cooling implementations increase flows of immersion cooling fluid at such high power use component locations, thereby increasing cooling capability of the oil immersion IHS cooling system. The increased "pull" on the fluid flow within the system (e.g., in the area of the ducted heatsink) will also aid in cooling other components within the system and aid in overall immersion cooling system flow balancing across the IHSs within the immersion cooling system tank.

In various implementation embodiments of the present systems and methods, CPU heatsinks, or the like are replaced with a cold plate or other ducted solution designed for single phase immersion fluids. A hose connects the outlet side of the cold plate assembly to the inlet/suction side of the immersion system pump. Fluid is pulled from the tank directly through the CPU cold plate which increases the flow directly at the CPU compared to existing passive solutions. The increased flow through the CPU cold plate assembly significantly increases the cooling of the CPU thus allowing for higher power CPUs to be used in immersion cooling compared to existing solutions. The suction flow through the connected components (CPU, GPU, etc.) will also aid in pulling flow through the system which will help balance flows through all systems within the immersion tank. With dedicated flows for the CPU, any preheat issues for components downstream is eliminated, in accordance with embodiments of the present systems and methods.

Figure 3:
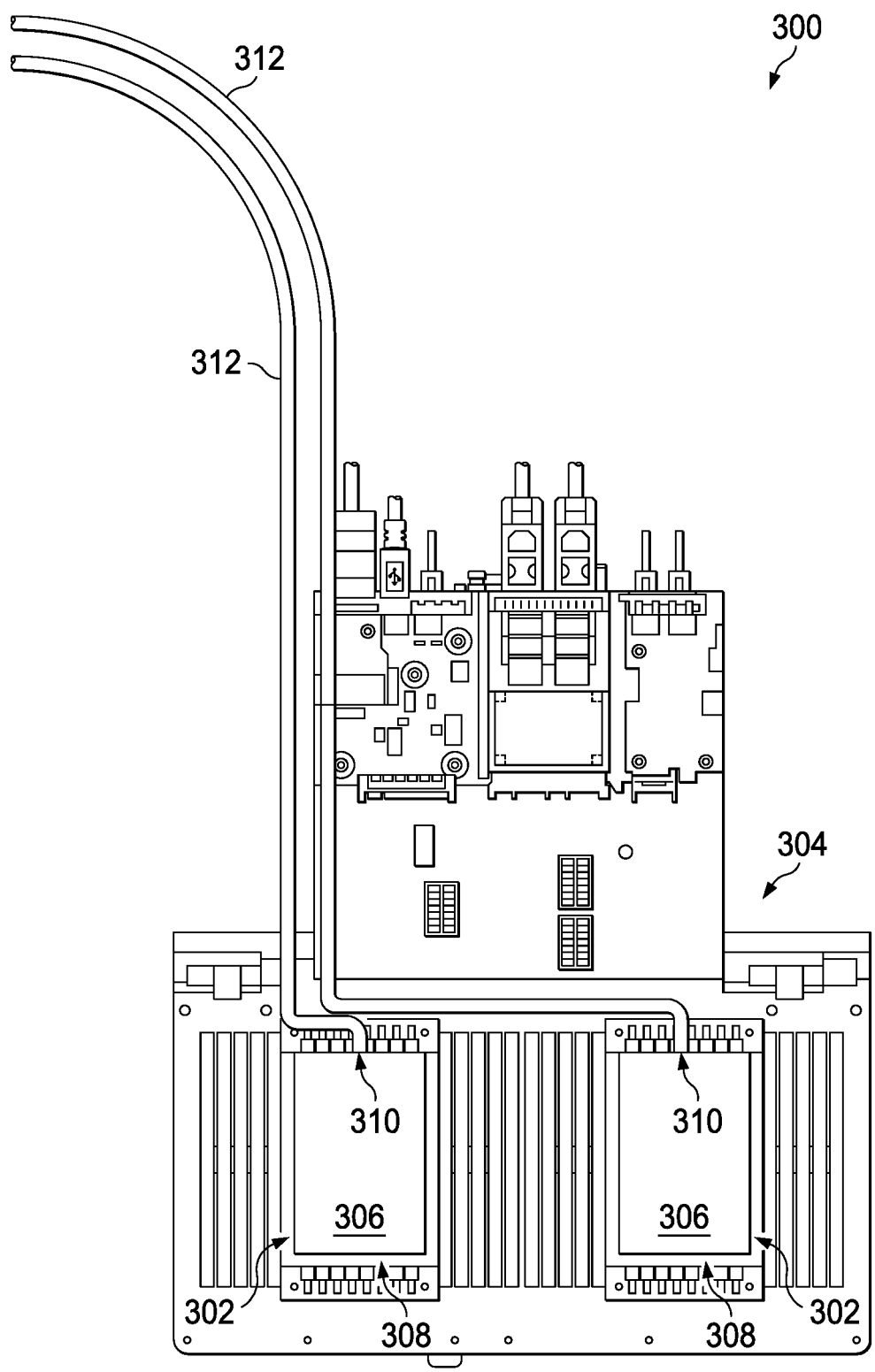
FIG. 3 is a diagrammatic illustration of an example IHS board employing an IHS component immersion cooling apparatus, according to some embodiments of the present systems and methods.
Figure 4:
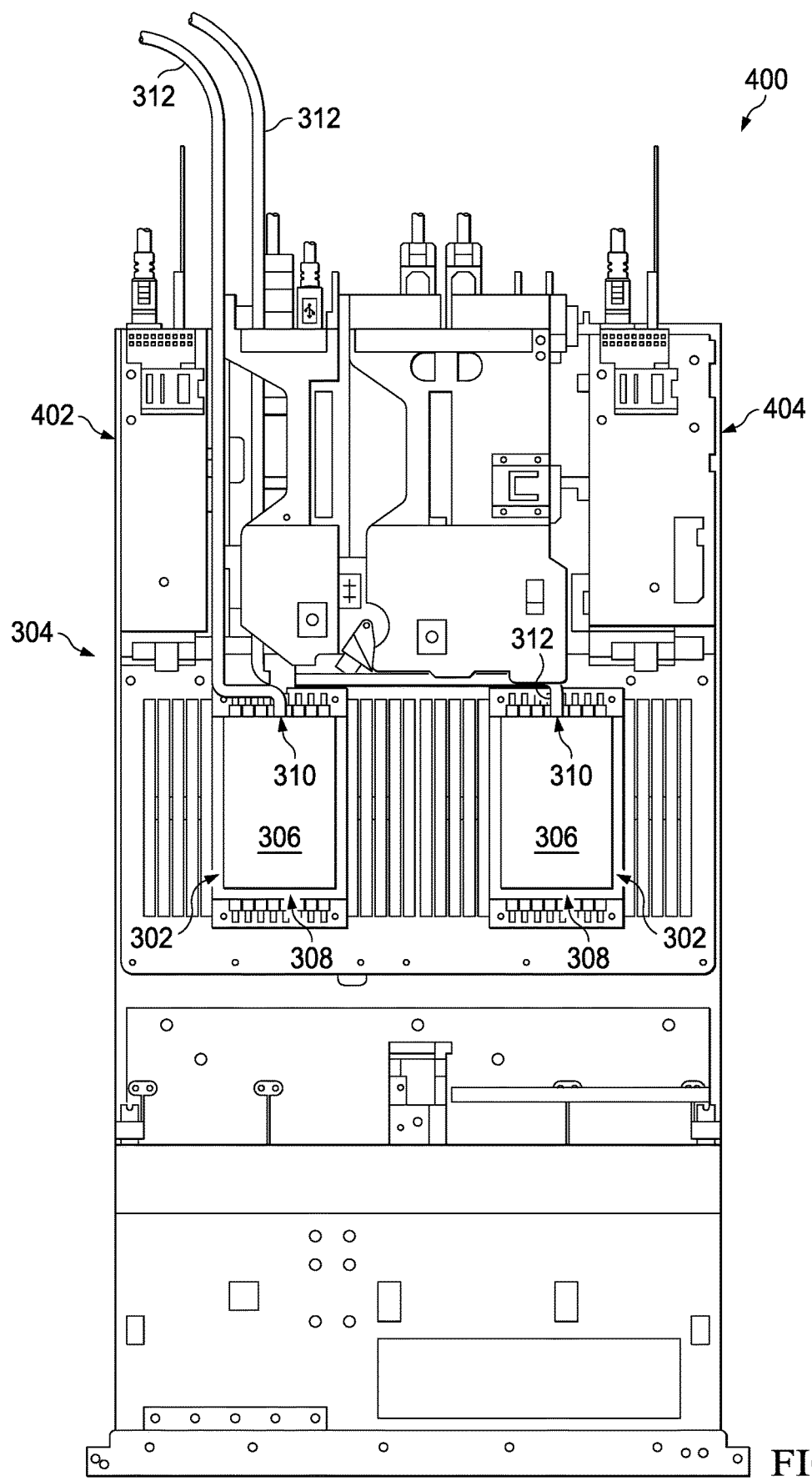
FIG. 4 is a diagrammatic illustration of an example IHS employing an IHS component immersion cooling apparatus, according to some embodiments of the present systems and methods.
Figure 5:
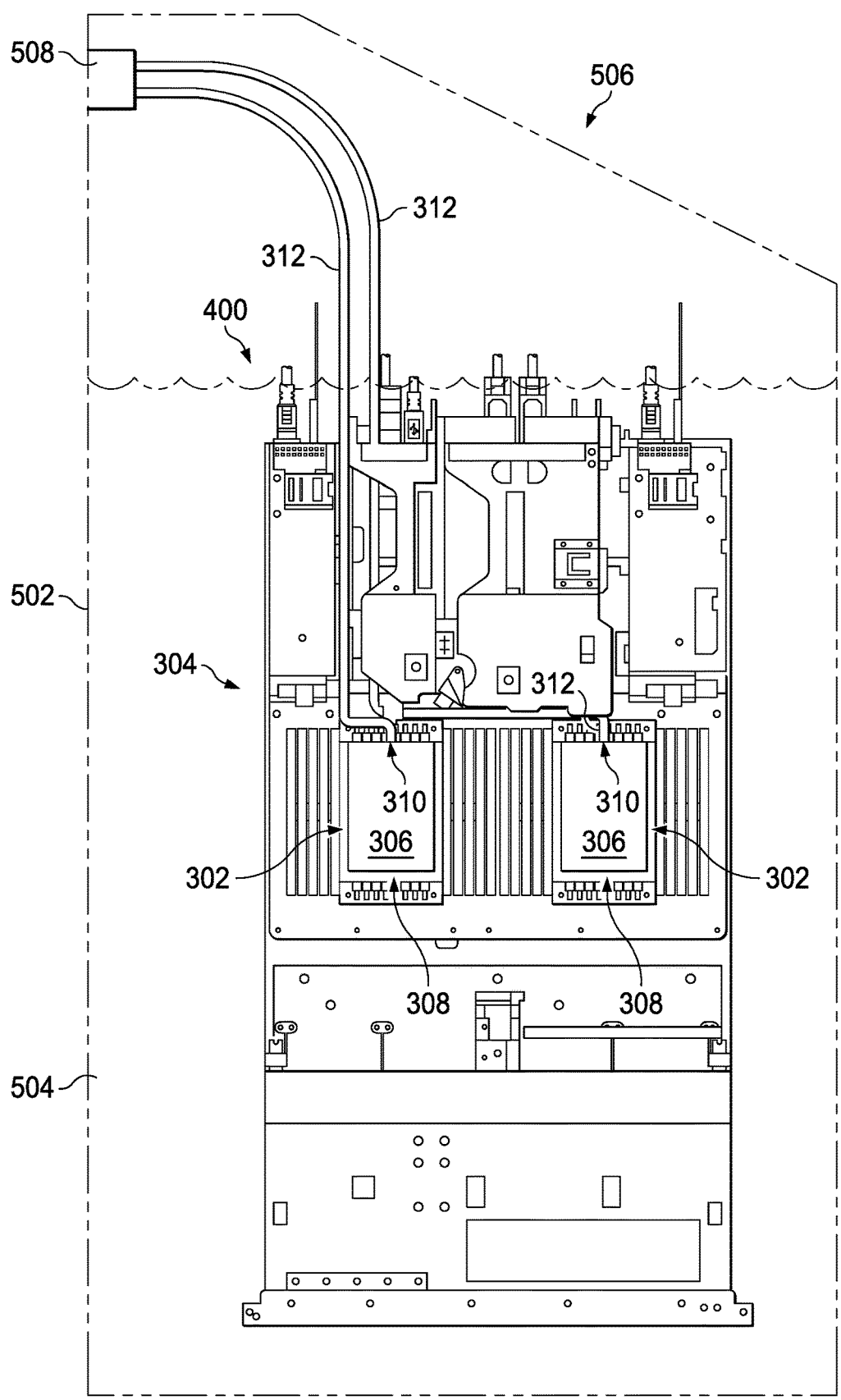
FIG. 5 is a diagrammatic illustration of an example IHS employing an IHS component immersion cooling apparatus deployed in an immersion cooling tank, according to some embodiments of the present systems and methods.
Figure 6:
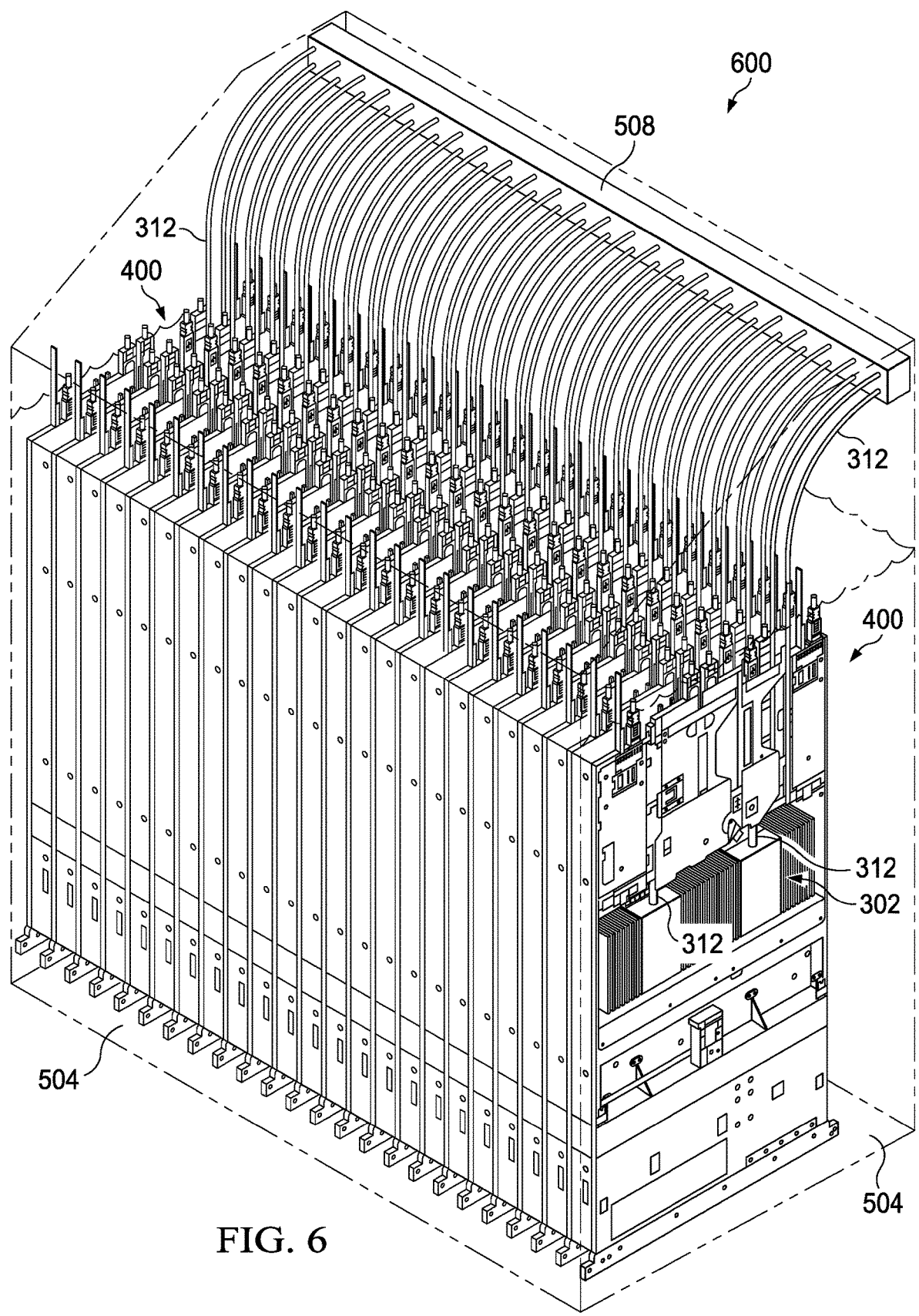
FIG. 6 is a diagrammatic illustration of an example immersion cooling tank in which a plurality of example IHSs, each employing an IHS component immersion cooling apparatus, are deployed, according to some embodiments of the present systems and methods.

FIG. 3 is a diagrammatic illustration of example IHS board 300 employing IHS component immersion cooling apparatus 302, according to some embodiments of the present systems and methods and FIG. 4 is a diagrammatic illustration of example IHS 400 employing IHS component immersion cooling apparatus 302, according to some embodiments of the present systems and methods. FIG. 5 is a diagrammatic illustration of example IHS 400 employing IHS component immersion cooling apparatus 302 deployed in immersion cooling tank 502 (e.g., tank 108 of FIG. 1), according to some embodiments of the present systems and methods. IHS board 300, and hence IHS 400, has chassis 304 configured enable IHS 300 to be at least partially disposed under a surface of an immersion fluid 504, such as the aforementioned dielectric fluid coolant. Similar to as discussed above, tank 502 may include top 506 and a rack, or the like, such as above discussed flange 110. IHS chassis 304 is mountable on the rack such that the IHS is removable from the tank through top 506 while another IHS remains in operation at least partially disposed under the surface of immersion fluid 504. IHS chassis 304 mounts at least one component (e.g., one or more CPUs, a GPU, etc.) configured to be cooled by immersion fluid 504 during operation of IHS 400. IHS board 300 may be a server, or the like and may mount one or more riser or expansion cards or boards 402, 404, etc., such as a graphics card, networking card, crypto mining or blockchain card, power supply, GPU, General Purpose Graphics Processing Unit (GPGPU), rotational storage device, flash storage device, memory device, battery, voltage regulator, Peripheral Component Interconnect Express (PCIe) switch, Field Programmable Gate Array (FPGA), etc. FIG. 6 is a diagrammatic illustration of example immersion cooling tank 600 in which a plurality of example IHSs 602, each employing IHS component immersion cooling apparatus(es) 302, are deployed, according to some embodiments of the present systems and methods.

In accordance with embodiments of the present systems and methods, IHS component immersion cooling apparatus 302 comprises immersion fluid flow passage housing 306 disposed in conjunction with, such as over, or on, the one or more component(s) configured to be cooled by immersion fluid 504 during operation of IHS 400. IHS component immersion cooling apparatus 302 further comprises immersion fluid inlet 308, which may comprise an opening or vent in fluid flow passage housing 306, open to immersion fluid 504. IHS component immersion cooling apparatus 302 also further comprises immersion fluid outlet 310, such as an outlet fitting, in fluid flow communication with inlet 308, through housing 306. Immersion fluid outlet 310 is further configured to be connected to return line 312 of an immersion fluid pump. This immersion fluid pump may be an immersion fluid circulation pump configured to circulate immersion fluid 504 held in tank 502, such as pump 104, which may be disposed outside immersion cooling tank 502. This pump may also, thereby circulate immersion fluid 504 within immersion cooling tank 502. Suction hoses 312, may be connected as one line per connected component or aggregated, as a single system suction hose using fittings or a small manifold. Thus, in accordance with some embodiments of the present systems and methods, tank 502 may have manifold 508 in fluid flow communication with the immersion fluid pump. In such embodiments, manifold 508 is configured to receive a plurality of return lines 312, each from an IHS component cooling apparatus 302. In accordance with some embodiments of the present systems and methods immersion cooling flow passage housing 306 may be a cold plate, while in other embodiments, immersion cooling flow passage housing 306 may be a ducted heatsink configured to be disposed on, or about, the one or more IHS components of the IHS disposed in the immersion cooling tank.

Figure 7:
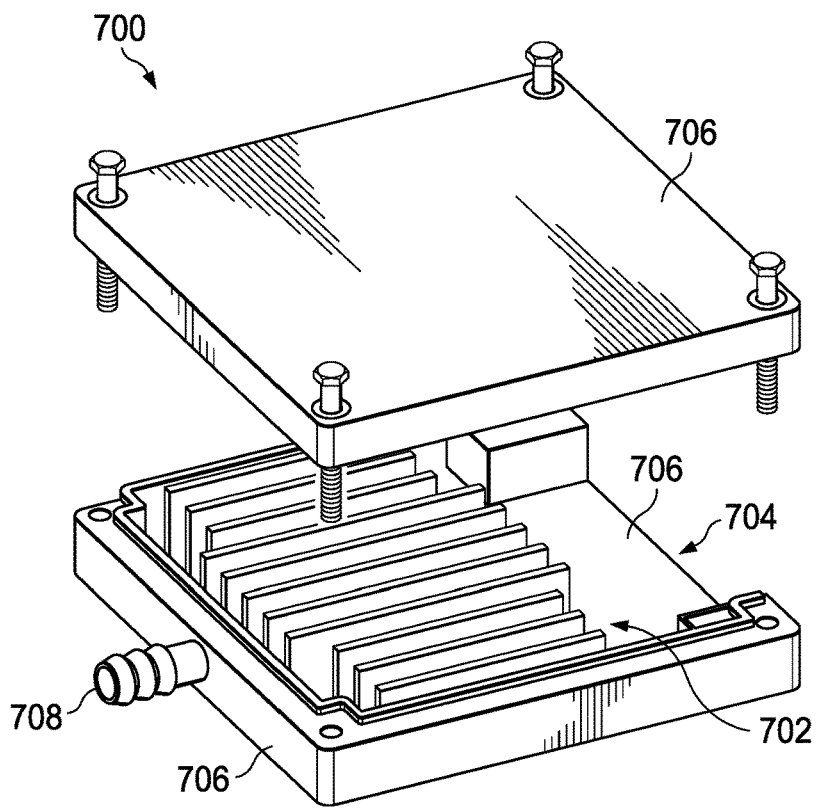
FIG. 7 is a partially fragmented diagrammatic illustration of an example cold plate IHS component immersion cooling apparatus, according to some embodiments of the present systems and methods.

In accordance with some embodiments of the present systems and methods, existing cold plates may be used but might require optimization for single phase immersion fluid flows. In such embodiments a cold plate with depopulated inlet fitting and suction hose 312 connected at the cold plate outlet port may be used. FIG. 7 is a partially exploded diagrammatic illustration of example cold plate IHS component immersion cooling apparatus 700, according to some embodiments of the present systems and methods. Heatsink 702 may be optimized for single phase immersion fluid flows. Cold plate 700 has an opening (or vent) 704 in cold plate housing 706, open to immersion fluid, rather than a depopulated inlet fitting, or the like. Assembled housing 706 is adapted to be thermally coupled (and secured) to a surface of a component to be cooled, such as a CPU, GPU, or the like. Suction hose 312 may be connected at cold plate outlet port 708.

Figure 8:
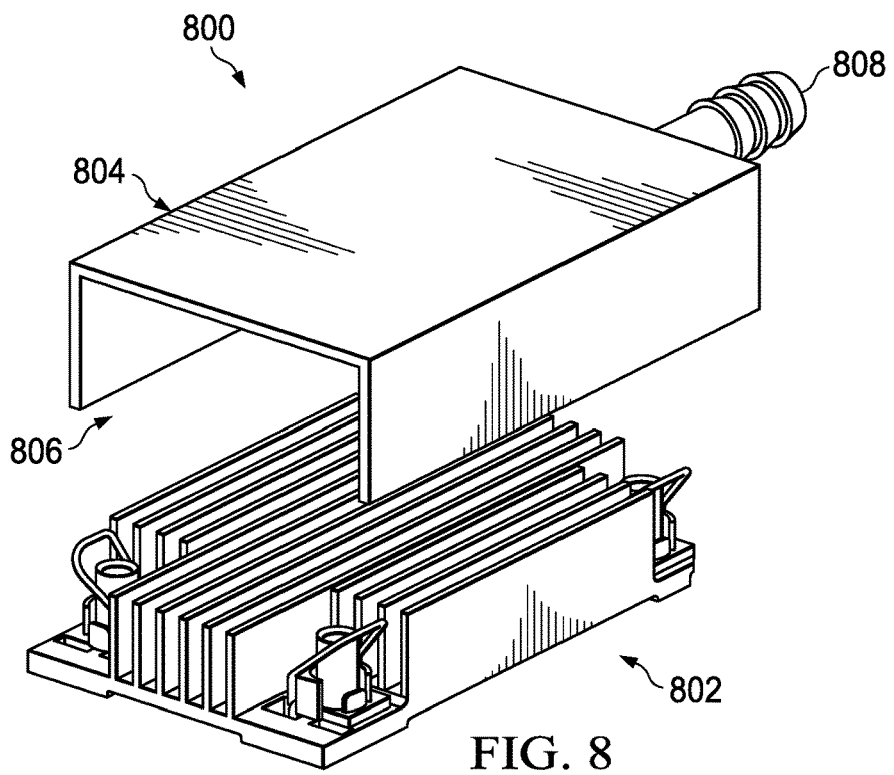
FIG. 8 is an exploded diagrammatic illustration of an example ducted heatsink IHS component immersion cooling apparatus, according to some embodiments of the present systems and methods.

FIG. 8 is an exploded diagrammatic illustration of example ducted heatsink IHS component immersion cooling apparatus 800, according to some embodiments of the present systems and methods. Ducted heatsink 800 comprises heatsink 802 with duct or shroud 804 disposed over it. Heatsink 802 is adapted to be thermally coupled (and secured) to a surface of a component to be cooled, such as a CPU, GPU, or the like. Bottom 806 of duct or shroud 804 is open (or vented) to immersion fluid. Duct or shroud 804 is connected to suction hose 312, via fitting 808, or the like to ensure immersion fluid flow is directed (into opening 806 and) over the heatsink's fins. IHS component immersion cooling apparatus 800 is a straightforward low-cost solution in accordance with embodiments of the present systems and methods.

In operation, immersion cooling of one or more IHS components in accordance with embodiments of the present systems and methods may include disposing IHS component immersion cooling flow passage housing 306 at one or more IHS components to be cooled by immersion fluid 504 during operation of the IHS. This immersion cooling flow passage housing may be a cold plate in some embodiments, which in operation is disposed on the one or more IHS components to be cooled, or in other embodiments the immersion cooling flow passage housing may be a ducted heatsink, which in operation is disposed on, or about, the one or more IHS components to be cooled, such as by drawing immersion fluid from the immersion cooling tank over the heatsink. In either such embodiments, this IHS component immersion cooling flow passage housing may include open immersion fluid inlet 308 and immersion fluid outlet (fitting) 310, which in operation is connected to return line 312 of an immersion fluid pump (104) for drawing immersion fluid 504 from immersion cooling tank 502, through IHS component immersion cooling flow passage housing 306 and out of immersion cooling tank 502.

Figure 9:
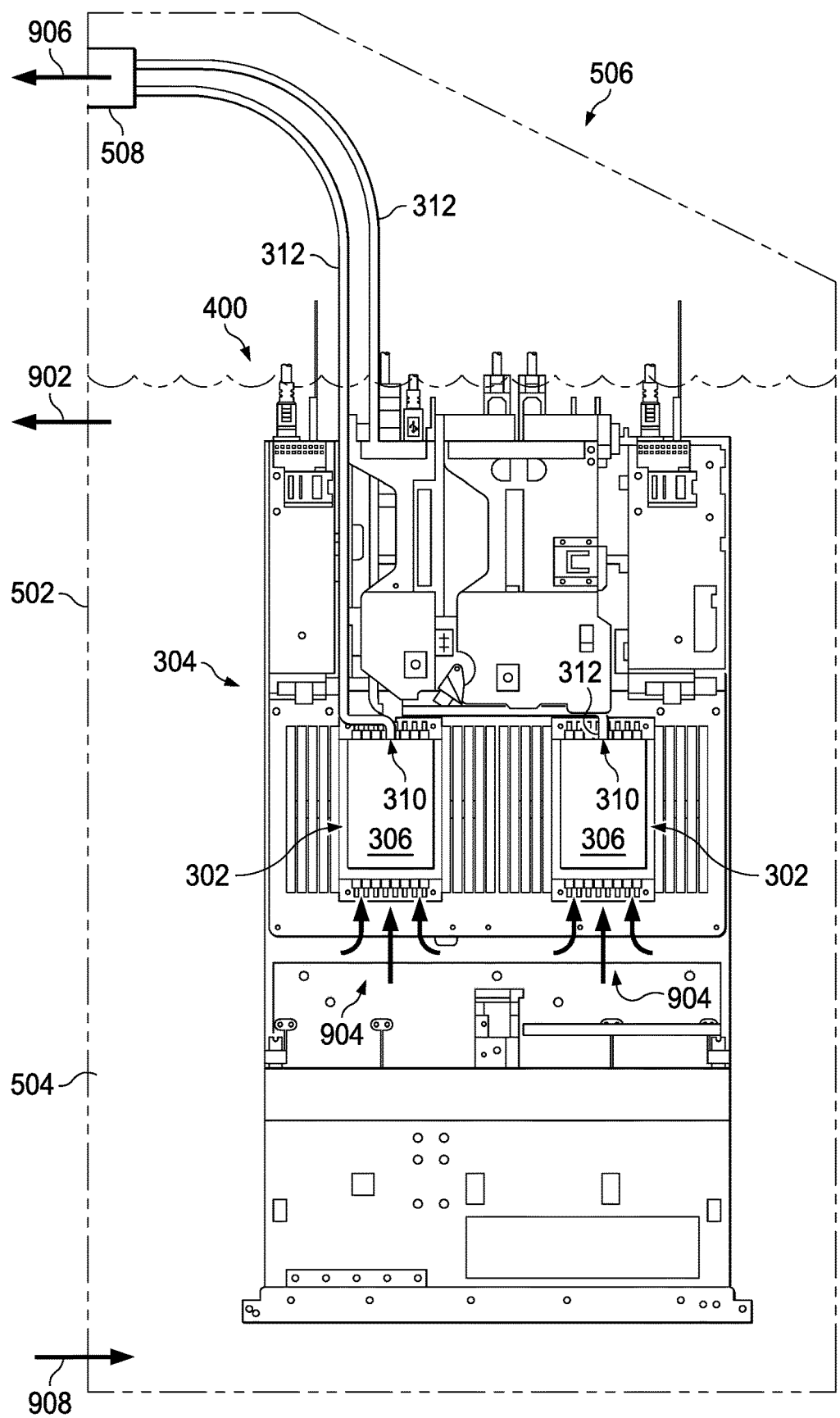
FIG. 9 is a diagrammatic illustration of immersion fluid flow in an immersion cooling tank, wherein an example IHS is employing IHS component immersion cooling apparatuses, according to some embodiments of the present systems and methods.

FIG. 9 is a diagrammatic illustration of immersion fluid flow in an immersion cooling tank, wherein example IHS 400 (of FIG. 5) is employing IHS component immersion cooling apparatuses 302, according to some embodiments of the present systems and methods. In accordance with such implementation of the present systems and methods, bulk flow through the tank continues as normal from the top surface of immersion fluid in the tank, at 902 (although, in some embodiments, at a reduced rate). However, in accordance with embodiments of the present systems and methods, a new flow path is created within the tank (and each IHS) at 904 via the suction lines. Therein In accordance with some (optimized) embodiments of the present systems and methods, a valve control system may be utilized to control the rate of flow at tank bulk return 902 and at the suction manifold return to pump 906. For example, under high workloads a valve for the suction manifold may be completely open while a bulk return valve is throttled to a minimum flow rate. In such cases, the bulk return valve may open parodically to control the bulk temperature of the fluid within the tank. (i.e., to provide high bulk flow at the tank to quickly reduce tank fluid temperatures). Also, in such, or other embodiments, the pump speed may also be incorporated into this control loop to balance or manipulate flows at the suction manifold or tank bulk return. Additionally, or alternatively, a separate (set of) pump(s) may (also) be used for the suction return lines and/or manifold, rather than the tank bulk flow pump. Immersion fluid is returned to the tank at 908 Embodiments of the present systems and methods may utilize Intelligent Platform Management Interface (IPMI), Dell Technogies' OpenManage™, or other data center tools to gather information on system cooling needs in order to determine the proper valve position, pump speeds, etc.

Figure 10:
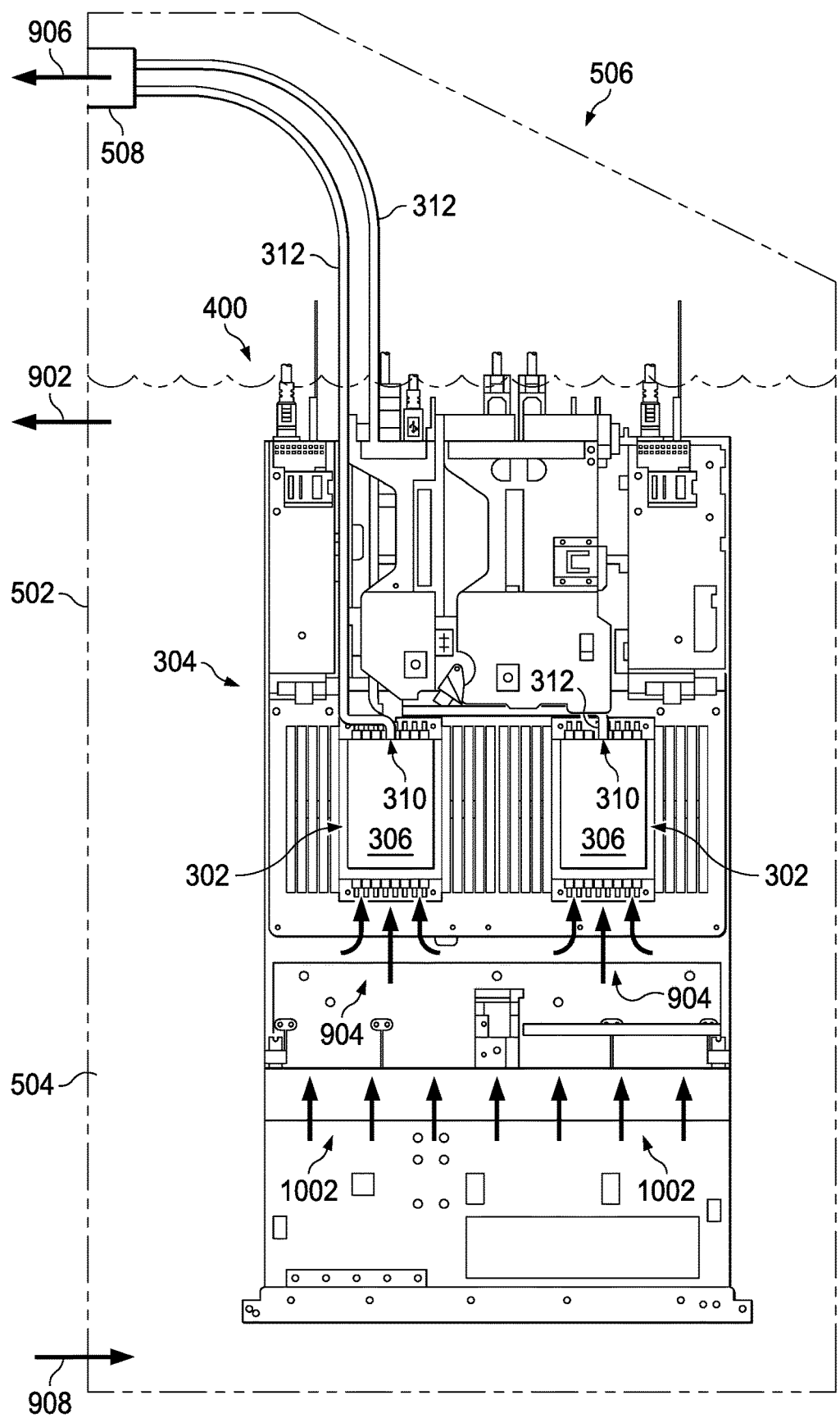
FIG. 10 is a diagrammatic illustration of an example of improved IHS immersion fluid flow, according to some embodiments of the present systems and methods.

FIG. 10 is a diagrammatic illustration of an example of improved IHS immersion fluid flow, according to some embodiments of the present systems and methods. As shown in FIG. 10, net flow 1002 through an IHS is increased due to the hose connection to the return/suction side of the pump pulling flow through the IHS component immersion cooling apparatus. Further, this increase in flow pulls more fluid into the IHS. If IHSs in a tank are adapted in accordance with embodiments of the present systems and methods immersion fluid flow balance between IHSs will be improved. This may be of particular important for tanks with varying types of IHSs and/or other hardware (i.e., different system impedances). IHS architectures may be optimized, in accordance with embodiments of the present systems and methods, to take advantage of this increased flow, such as by locating components near or in the flow path to the CPUs or directing flow to the CPUs inlet area so that the flow passes over components that will benefit from the higher fluid velocities. In addition, because the heated fluid leaving the CPU (or GPU, etc.) is immediately directed back to the pump, preheat impacts of components downstream of the CPU are eliminated.

Figure 11:
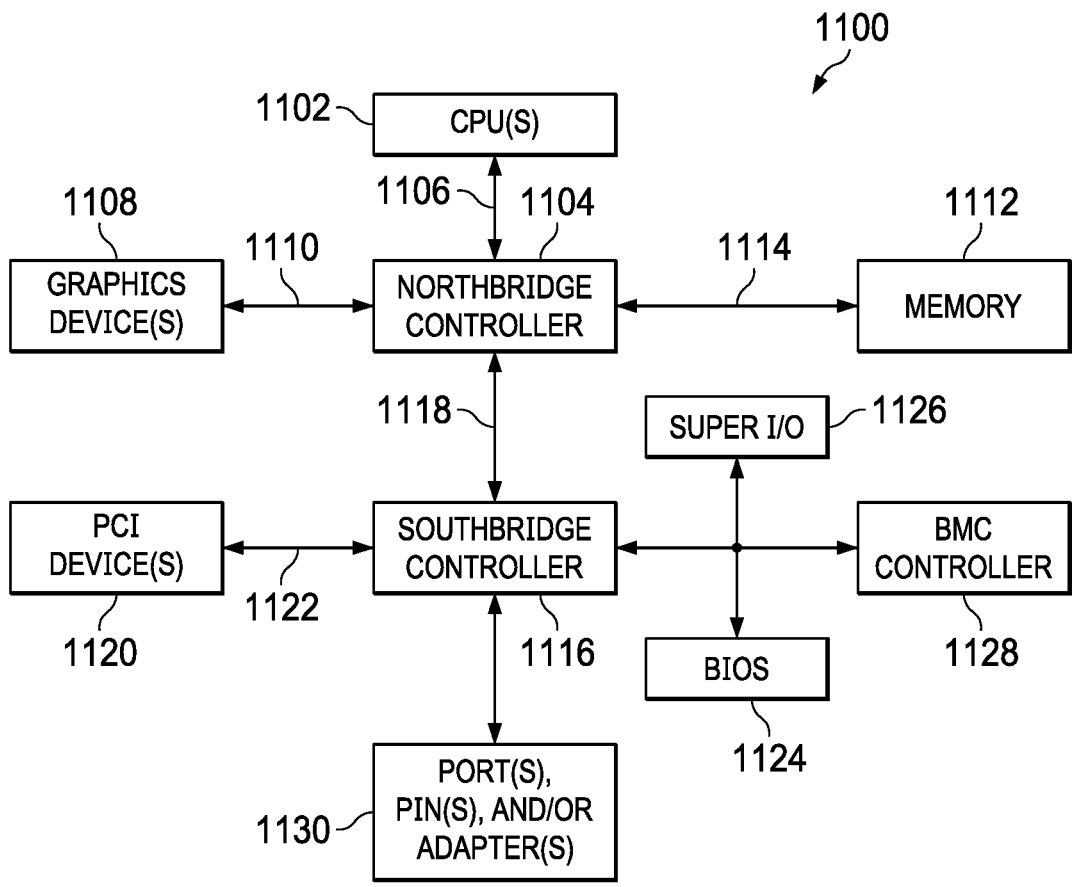
FIG. 11 is a diagram of an example of an IHS according to some embodiments.

FIG. 11 is a block diagram an example of IHS 1100 which may be cooled within tank 101 of system 100. As shown, IHS 1100 includes one or more CPUs 1102. In various embodiments, IHS 1100 may be a single-processor system including one CPU 1102, or a multi-processor system including two or more CPUs 1102 (e.g., two, four, eight, or any other suitable number). CPU(s) 1102 may include any processor capable of executing program instructions. For example, in various embodiments, CPU(s) 1102 may be general-purpose or embedded processors implementing any of a variety of instruction set architectures (ISAs), such as the x86, POWERPC, ARM, SPARC, or MIPS ISAs, or any other suitable ISA. In multi-processor systems, each of CPU(s) 1102 may commonly, but not necessarily, implement the same ISA. In an embodiment, a motherboard (not shown) may be configured to provide structural support, power, and electrical connectivity between the various components illustrated in FIG. 11.

CPU(s) 1102 are coupled to northbridge controller or chipset 1104 via front-side bus 1106. Northbridge controller 1104 may be configured to coordinate I/O traffic between CPU(s) 1102 and other components. For example, in this particular implementation, northbridge controller 1104 is coupled to graphics device(s) 1108 (e.g., one or more video cards or adaptors, etc.) via graphics bus 1110 (e.g., an Accelerated Graphics Port or AGP bus, a Peripheral Component Interconnect or PCI bus, etc.). Northbridge controller 1104 is also coupled to system memory 1112 via memory bus 1114. Memory 1112 may be configured to store program instructions and/or data accessible by CPU(s) 1102. In various embodiments, memory 1112 may be implemented using any suitable memory technology, such as static RAM (SRAM), synchronous dynamic RAM (SDRAM), nonvolatile/Flash-type memory, or any other type of memory.

Northbridge controller 1104 is coupled to southbridge controller or chipset 1116 via internal bus 1118. Generally, southbridge controller 1116 may be configured to handle various of IHS 1100's I/O operations, and it may provide interfaces such as, for instance, Universal Serial Bus (USB), audio, serial, parallel, Ethernet, etc., via port(s), pin(s), and/or adapter(s) 1130 over bus 1124. For example, southbridge controller 1116 may be configured to allow data to be exchanged between IHS 1100 and other devices, such as other IHSs attached to a network. In various embodiments, southbridge controller 1116 may support communication via wired or wireless general data networks, such as any suitable type of Ethernet network, for example, via telecommunications/telephony networks such as analog voice networks or digital fiber communications networks; via storage area networks such as Fiber Channel SANs; or via any other suitable type of network and/or protocol.

Southbridge controller 1116 may also enable connection to one or more keyboards, keypads, touch screens, scanning devices, voice or optical recognition devices, or any other devices suitable for entering or retrieving data. Multiple I/O devices may be present in IHS 1100. In some embodiments, I/O devices may be separate from IHS 1100 and may interact with IHS 1100 through a wired or wireless connection. As shown, southbridge controller 1116 is further coupled to one or more PCI devices 1120 (e.g., modems, network cards, sound cards, video cards, etc.) via PCI bus 1122, including, for example, self-encrypting Hard Disk Drives (HDDs) or Solid State Drives (SSDs). Southbridge controller 1116 is also coupled to Basic I/O System (BIOS) 1124, Super I/O Controller 1126, and Baseboard Management Controller (BMC) 1128 via Low Pin Count (LPC) bus 1120.

BIOS 1124 includes non-volatile memory having program instructions stored thereon. Those instructions may be usable CPU(s) 1102 to initialize and test other hardware components and/or to load an Operating System (OS) onto IHS 1100. As such, BIOS 1124 may include an interface that allows CPU(s) 1102 to load and execute certain firmware. In some cases, such firmware may include program code that is compatible with the Unified Extensible Firmware Interface (UEFI) specification, although other types of firmware may be used.

BMC controller 1128 may include non-volatile memory having program instructions stored thereon that are usable by CPU(s) 1102 to enable remote management of IHS 1100. For example, BMC controller 1128 may enable a user to discover, configure, and manage BMC controller 1128, setup configuration options, resolve and administer hardware or software problems, etc. Additionally, or alternatively, BMC controller 1128 may include one or more firmware volumes, each volume having one or more firmware files used by the BIOS' firmware interface to initialize and test components of IHS 1100.

Super I/O Controller 1126 combines interfaces for a variety of lower bandwidth or low data rate devices. Those devices may include, for example, floppy disks, parallel ports, keyboard and mouse, temperature sensor and fan speed monitoring, etc.

In some cases, IHS 1100 may be configured to access different types of computer-accessible media separate from memory 1112. Generally speaking, a computer-accessible medium may include any tangible, non-transitory storage media or memory media such as electronic, magnetic, or optical media—e.g., magnetic disk, a hard drive, a CD/DVD-ROM, a Flash memory, etc. coupled to IHS 1100 via northbridge controller 1104 and/or southbridge controller 1116.

The terms "tangible" and "non-transitory," as used herein, are intended to describe a computer-readable storage medium (or "memory") excluding propagating electromagnetic signals; but are not intended to otherwise limit the type of physical computer-readable storage device that is encompassed by the phrase computer-readable medium or memory. For instance, the terms "non-transitory computer readable medium" or "tangible memory" are intended to encompass types of storage devices that do not necessarily store information permanently, including, for example, RAM. Program instructions and data stored on a tangible computer-accessible storage medium in non-transitory form may afterwards be transmitted by transmission media or signals such as electrical, electromagnetic, or digital signals, which may be conveyed via a communication medium such as a network and/or a wireless link.

A person of ordinary skill in the art will appreciate that IHS 1100 is merely illustrative and is not intended to limit the scope of the disclosure described herein. In particular, any computer system and/or device may include any combination of hardware or software capable of performing certain operations described herein. In addition, the operations performed by the illustrated components may, in some embodiments, be performed by fewer components or distributed across additional components. Similarly, in other embodiments, the operations of some of the illustrated components may not be performed and/or other additional operations may be available.

For example, in some implementations, northbridge controller 1104 may be combined with southbridge controller 1116, and/or be at least partially incorporated into CPU(s) 1102. In other implementations, one or more of the devices or components shown in FIG. 11 may be absent, or one or more other components may be added. Accordingly, systems and methods described herein may be implemented or executed with other computer system configurations.

A person of ordinary skill will recognize that IHS 1100 of FIG. 11 is only one example of a system in which the certain embodiments may be utilized. Indeed, the embodiments described herein may be used in various electronic devices, such as network router devices, televisions, custom telecommunications equipment for special purpose use, etc. That is, certain techniques described herein are in no way limited to use with the IHS of FIG. 11.

It should be understood that various operations described herein may be implemented in software executed by processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. An information handling system (IHS) component immersion cooling apparatus comprising:
   an IHS component immersion cooling flow ducted heatsink, comprising:
      a shroud disposed over a heatsink, the shroud configured to be disposed on, or about, one or more IHS components of an IHS disposed in an immersion cooling tank, the shroud comprising:
         an immersion fluid inlet comprising an open end, open to immersion fluid within the immersion cooling tank; and
         an immersion fluid outlet having an area less than an area of the immersion fluid inlet and configured to be directly connected to a return line of an immersion fluid pump.

2. The IHS component cooling apparatus of claim 1, wherein the immersion fluid pump is an immersion fluid pump that also circulates the immersion fluid within the immersion cooling tank.

3. The IHS component cooling apparatus of claim 1, wherein the immersion cooling tank further comprises a manifold in fluid flow communication with the immersion fluid pump, the manifold configured to receive a plurality of return lines, each from an IHS component cooling apparatus.

4. The IHS component cooling apparatus of claim 1, wherein the shroud further comprises a cover member fastened to a base member of the ducted heatsink.

5. An information handling system (IHS) comprising:
a chassis configured to be at least partially disposed under a surface of an immersion fluid, the chassis comprising at least one component configured to be cooled by the immersion fluid during operation of the IHS; and
an IHS component immersion cooling flow ducted heatsink, comprising:
a shroud disposed over a heatsink, the shroud disposed on, or about, one or more of the at least one component configured to be cooled by the immersion fluid during operation of the IHS, the shroud comprising:
an immersion fluid inlet comprising an open end, open to immersion fluid; and
an immersion fluid outlet having an area less than an area of the immersion fluid inlet and configured to be configured to be connected to a return line of an immersion fluid pump.

6. The IHS of claim 5, wherein the IHS is a server.

7. The IHS of claim 5, wherein the immersion fluid comprises oil.

8. The IHS of claim 5, wherein the immersion fluid is held inside a tank, the tank comprising a top and a rack, and the chassis mountable on the rack such that the IHS is removable from the tank through the top while another IHS remains in operation at least partially disposed under the surface of the immersion fluid.

9. The IHS of claim 8, wherein the immersion fluid pump is an immersion fluid circulation pump configured to circulate the immersion fluid held in the tank.

10. The IHS of claim 8, wherein the tank further comprises a manifold in fluid flow communication with the immersion fluid pump, the manifold configured to receive a plurality of return lines.

11. The IHS of claim 5, wherein the one or more components comprises a central processing unit (CPU).

12. The IHS of claim 5, wherein the one or more components comprises a graphics processing unit (GPU).

13. The IHS of claim 5, wherein shroud comprises a cover member fastened to a base member of the ducted heatsink.

14. A method for fluid immersion cooling of one or more components of an information handling system (IHS), the method comprising:
disposing an IHS component immersion cooling flow ducted heatsink on, or about, the one or more components of the IHS to be cooled by an immersion fluid during operation of the IHS, the IHS component immersion cooling flow ducted heatsink comprising:
a shroud disposed over a heatsink;
an open immersion fluid inlet; and
an immersion fluid outlet having an area less than an area of the immersion fluid inlet and;
connecting a return line of an immersion fluid pump to the immersion fluid outlet; and
drawing the immersion fluid from an immersion cooling tank, in which the IHS is immersed, through the IHS component immersion cooling flow ducted heatsink and out of the immersion cooling tank.

15. The method of claim 14, wherein:
the drawing the immersion fluid from the immersion cooling tank through the IHS component immersion cooling flow ducted heatsink further comprises drawing the immersion fluid from the immersion cooling tank over the heatsink.

16. The method of claim 14, wherein:
the immersion fluid pump is an immersion fluid pump that also circulates the immersion fluid within the immersion cooling tank; and
wherein the drawing the immersion fluid from the immersion cooling tank through the IHS component immersion cooling flow ducted heatsink further comprises drawing the immersion fluid using the immersion fluid pump that also circulates the immersion fluid within the immersion cooling tank.

17. The method of claim 14, wherein:
the immersion cooling tank further comprises a manifold in fluid flow communication with the immersion fluid pump; and
the connecting the return line of the immersion fluid pump to the immersion fluid outlet further comprises connecting the return line from the immersion fluid outlet to the manifold.

18. The method of claim 14, wherein the shroud comprises a cover member fastened to a base member of the ducted heatsink.

19. The method of claim 14, wherein disposing the IHS component immersion cooling flow ducted heatsink on, or about, the one or more components of the IHS to be cooled further comprises disposing the shroud over an existing heatsink disposed on the one or more components of the IHS to be cooled.

20. The method of claim 14 wherein the tank comprises a top and a rack, and the method further comprises:
mounting the IHS on the rack; and
subsequently removing the IHS from the tank through the top while another IHS remains in operation at least partially disposed under the surface of the immersion fluid.

* * * * *